United States Patent [19]

Shibasaki et al.

[11] Patent Number: 4,835,510

[45] Date of Patent: May 30, 1989

[54] MAGNETORESISTIVE ELEMENT OF FERROMAGNETIC MATERIAL AND METHOD OF FORMING THEREOF

[75] Inventors: Ichiro Shibasaki; Yoshiyasu Sugimoto, both of Fuji, Japan

[73] Assignee: Asahi Kasei Kogyo Kabushiki Kaisha, Osaka, Japan

[21] Appl. No.: 139,843

[22] Filed: Dec. 30, 1987

[30] Foreign Application Priority Data

Jan. 9, 1987 [JP] Japan .................................. 62-1808

[51] Int. Cl.⁴ ............................................ H01L 43/00
[52] U.S. Cl. .................................. 338/32 R; 29/610.1
[58] Field of Search ...................... 338/32 R; 324/252; 360/113; 335/16; 29/610.1

[56] References Cited

U.S. PATENT DOCUMENTS 4,418,772  11/1983  Hayashida et al. ............ 338/32 R X
4,673,998   6/1987  Souda et al. .................. 338/32 R X
4,725,776   2/1988  Onedera et al. .................. 338/32 R Primary Examiner—C. L. Albritton
Attorney, Agent, or Firm—Finnegan, Henderson, Farabow, Garrett & Dunner

[57] ABSTRACT

Magnetoresistive elements of ferromagnetic material having a high sensitivity and an excellent reliability have been manufactured. According to such an element, the sensitivity thereof can be enhanced by restricting the sheet resistance of wiring portions to a low value, and it is possible to prevent generation of an offset voltage due to a discrepancy in alignment by broadening the width of wiring portions at the connecting portions between magnetically sensitive members and the wiring portions to be wider than that of the magnetically sensitive members and arranging the connecting portions so as to be disposed in a geometrically symmetrical relationship therebetween. Such a structure is adapted for connecting the magnetically members and the wiring portions in a self-aligning manner.

18 Claims, 31 Drawing Sheets

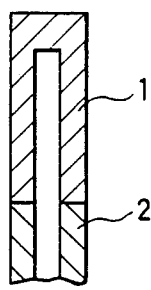
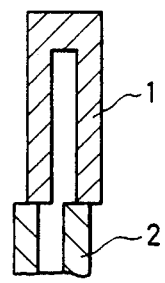
FIG-3A
PRIOR ART
FIG-3B
PRIOR ART
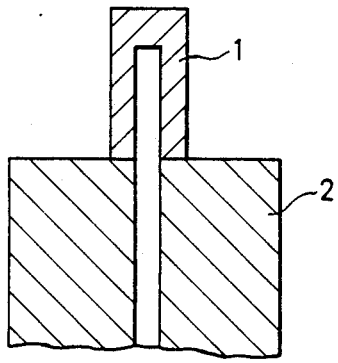
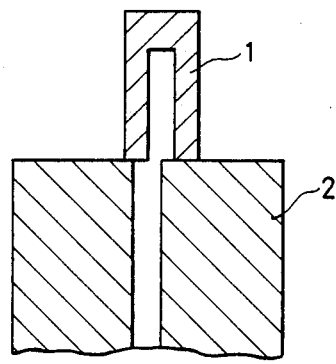
FIG-4A
PRIOR ART
FIG-4B
PRIOR ART

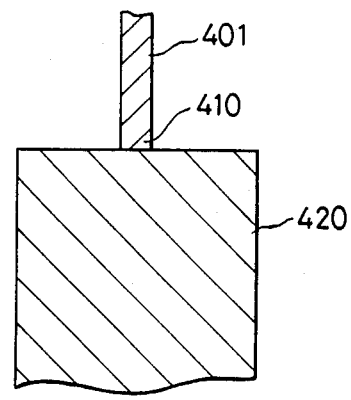
FIG-18
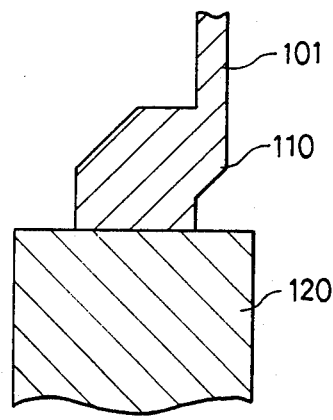 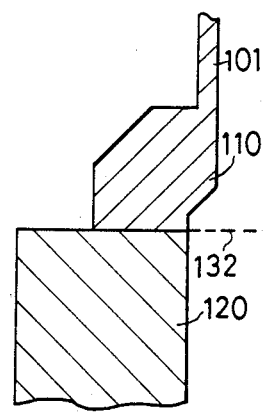
FIG-19A     FIG-19B

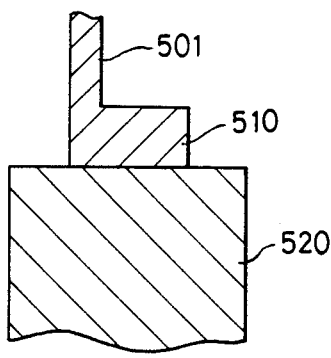
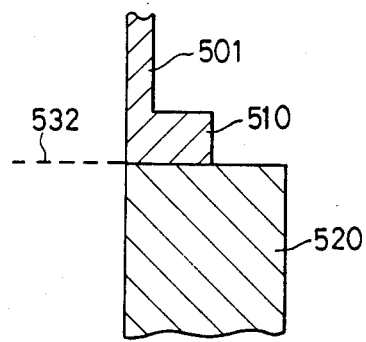
FIG-20A          FIG-20B
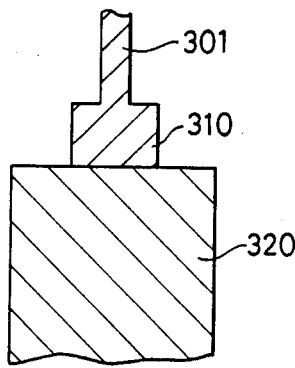
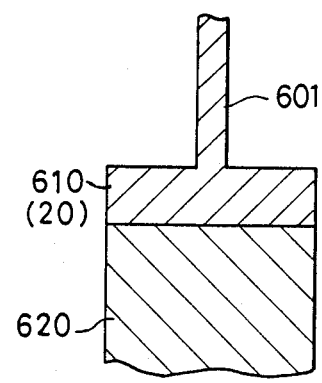
FIG-21          FIG-22

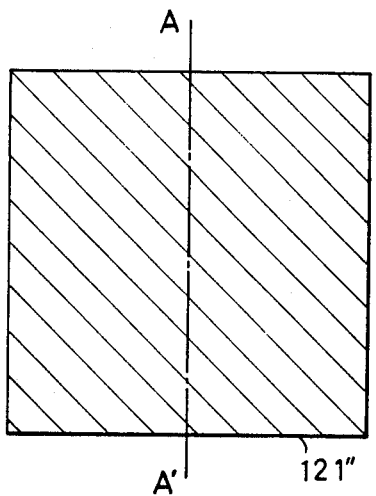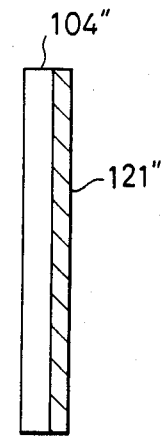
FIG-23A        FIG-23B
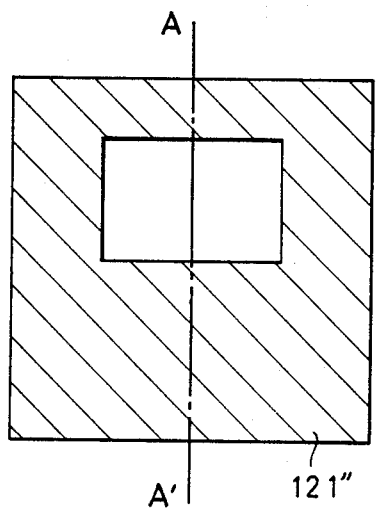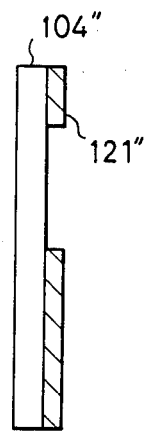
FIG-24A        FIG-24B

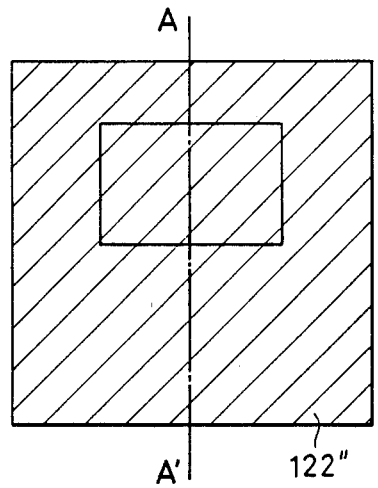
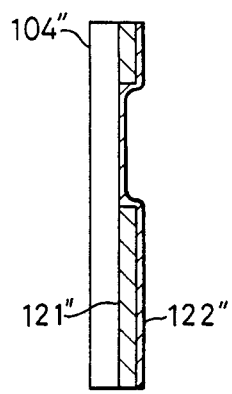
FIG-25A          FIG-25B
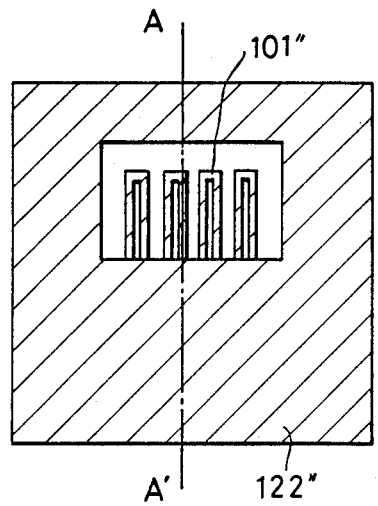
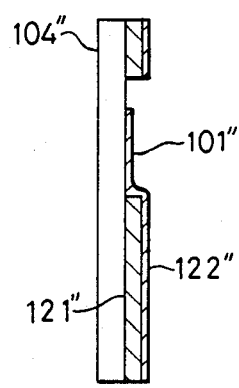
FIG-26A          FIG-26B

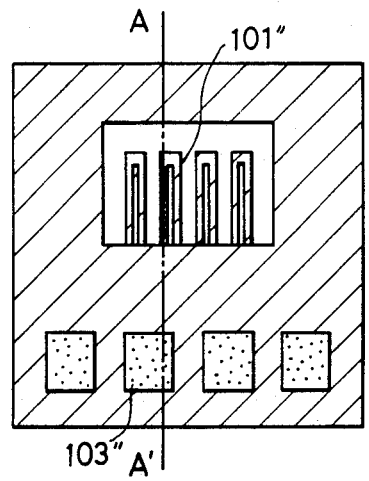 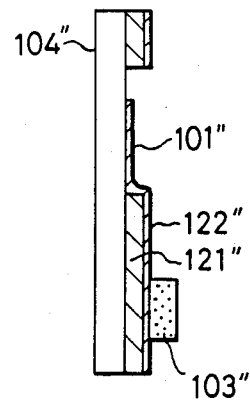
FIG-27A  FIG-27B
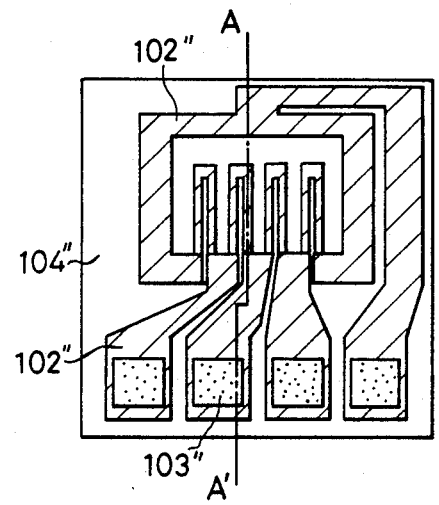 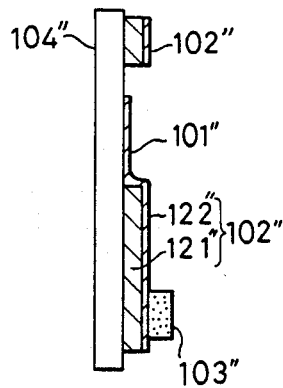
FIG-28A  FIG-28B

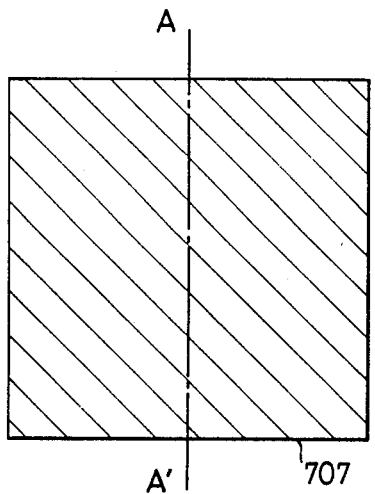
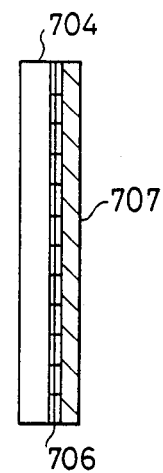
FIG-30A  FIG-30B
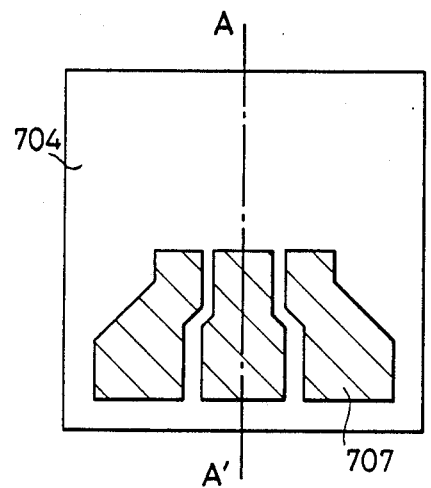
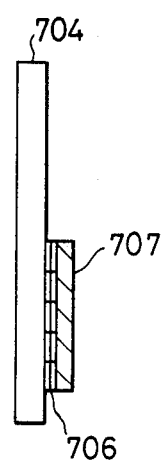
FIG-31A  FIG-31B

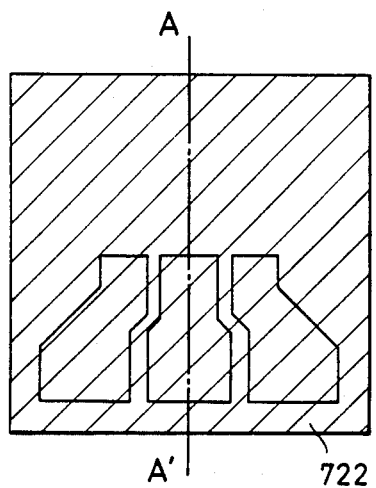 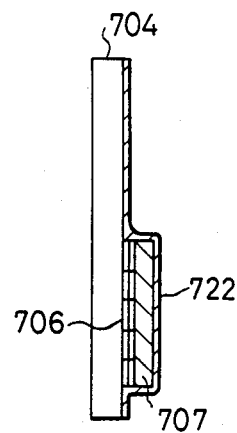
FIG-32A　　FIG-32B
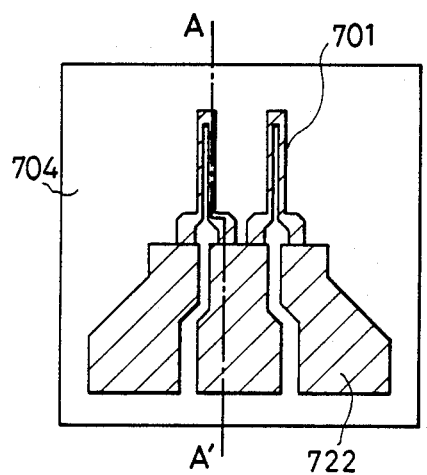 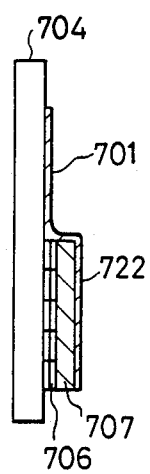
FIG-33A　　FIG-33B

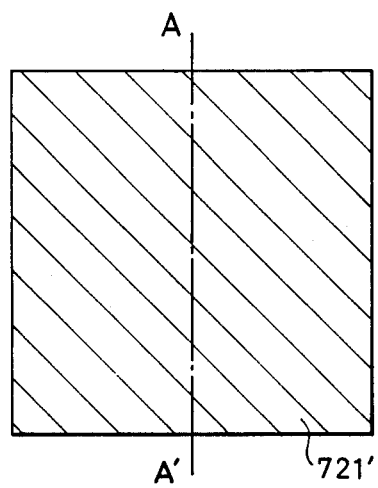
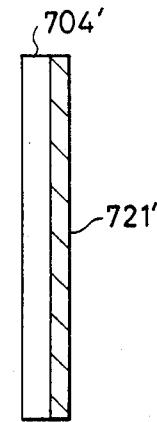
FIG-36A  FIG-36B
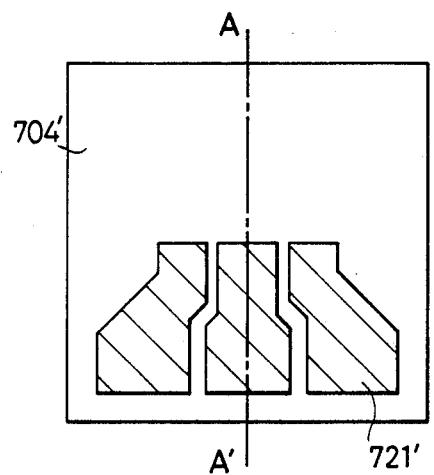
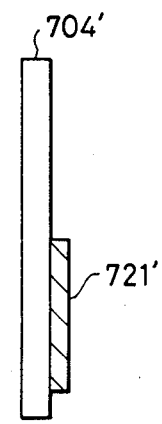
FIG-37A  FIG-37B

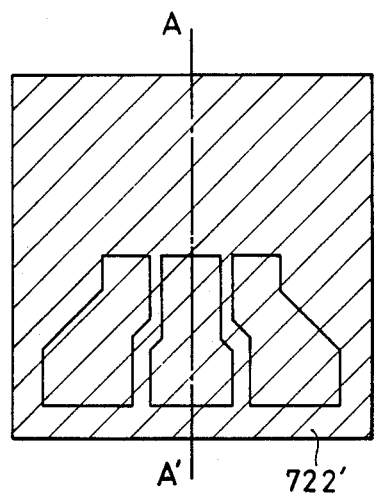
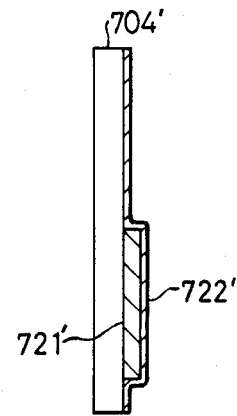
FIG-38A  FIG-38B
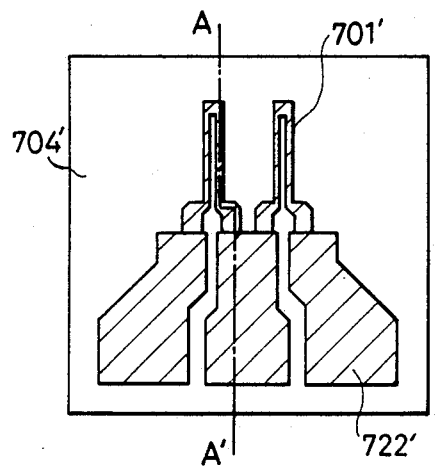
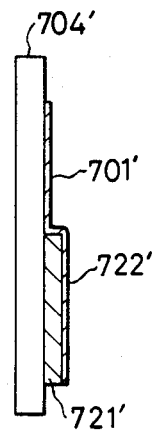
FIG-39A  FIG-39B

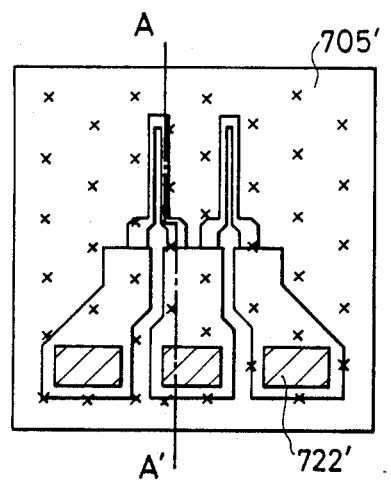
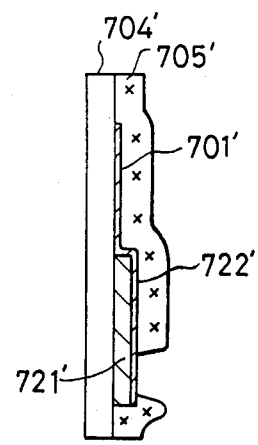
FIG-40A          FIG-40B
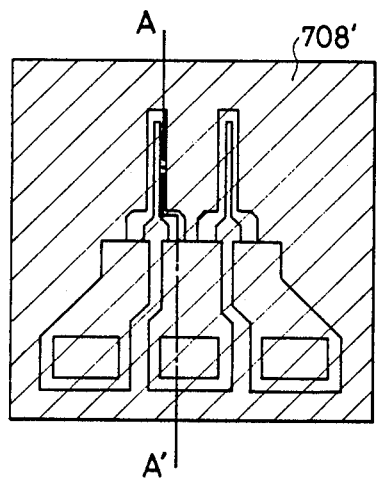
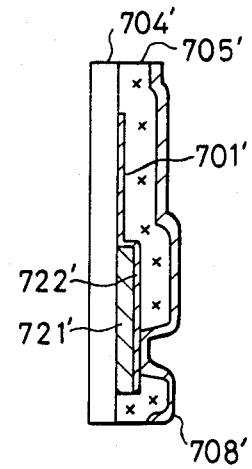
FIG-41A          FIG-41B

MAGNETORESISTIVE ELEMENT OF FERROMAGNETIC MATERIAL AND METHOD OF FORMING THEREOF

BACKGROUND OF THE INVENTION

1. Field of the Invention

The present invention relates to a magnetoresistive element of a ferromagnetic material.

2. Description of the Prior Art

Recently, magnetoresistive elements of ferromagnetic materials have been used for angular position detectors, magnetic sensors and the like. A magnetoresistive element of ferromagnetic material is an element in which the electric resistance varies depending upon the angle between the magnetization direction of the ferromagnetic material and the direction of an electric current passing therethrough when the ferromagnetic material is placed in a magnetic field.

Typical examples of magnetic materials having a magnetoresistance effect are Ni-Fe alloys, Ni-Co alloys and other ferromagnetic materials.

A typical example of such a magnetoresistive element of ferromagnetic material is shown in FIG. 1A and FIG. 1B, wherein FIG. 1A is a top plan view of a magnetoresistive element of ferromagnetic material and FIG. 1B is a sectional view of the element taken along the line A-A' of FIG. 1A. In the figures, there are shown a magnetoresistive element designated generally by the numeral 0. Element 0 has a magnetically sensitive member 1 formed in a pattern of narrow lines; wiring portions 2 formed so as to have widths of not less than several hundreds of microns; terminal portions 3 for external connection; and substrate 4. The sensitivity of such a magnetoresistive element is defined by $\Delta R/R$ wherein $\Delta R$ means magnitude of change in resistance of magnetically sensitive member 1 observed when a magnetic field is applied to the element, and R represents the resistance of the entire element. In order to enhance the sensitivity of the magnetoresistive element, it is required to make the value of $\Delta R$ much higher and to reduce the percentage of the resistance of the wiring portion 2. For this purpose, a method in which, when the film material used for wiring portions 2 is the same as that of the magnetically sensitive member 1, it is conventional to make the film thickness of the wiring portions 2 equal to that of the magnetically sensitive member 1 while the width thereof is enlarged, as shown in FIGS. 1A and 1B for simplicity.

Such a method has the advantage that the pattern of an element can easily be formed. However, the method suffers from several inherent problems. First, it is difficult to miniaturize the element because the sheet resistance of thin films is large and, consequently, a large substrate area is necessary to reduce the electrical resistance of the wiring portions. Second, a desired sensitivity often cannot be obtained since it is impossible to sufficiently lower the resistance of the wiring portions (the resistance of the wiring portions being usually 5 to 10% of the entire resistance). Third, the resistance value of the wiring portions can become unbalanced, i.e., an offset voltage is generated at the output side of the magnetoresistive element even when a magnetic field is not applied thereto, which in turn exerts an adverse effect on the properties of the element. This conventional method also suffers from problems such that if a thin film of the same thickness and material as those of the magnetically sensitive member 1 is used to form wiring portions 2, the sheet resistance thereof becomes large. In such cases it is not possible to ensure sufficient reliability since the external electric connection is not attained without difficulty.

Another method has been proposed in which the film thickness of wiring portion 2 is thicker than that of magnetically sensitive member 1. Still another proposed method would use for the wiring portions 2, materials having a higher conductivity than that of the magnetically sensitive member 1. These methods are capable of miniaturizing the size of the magnetoresistive element. FIGS. 2A and 2B show such a conventional magnetoresistive element, wherein FIG. 2A is a top plan view and FIG. 2B is a sectional view taken along the line A-A' of FIG. 2A. In these figures, the reference numeral 22 represents a part of wiring portion 2 which is formed simultaneously with the magnetically sensitive member 1 from the same material as that of the latter, and 21 represents a wiring member formed on part 22. In this case, the sensitive member portions 1 of the magnetically sensitive element and the wiring portions 2 of the magnetoresistive element differ from one another in the film thickness. Such a construction provides advantages such that the wiring portion has a low sheet resistance.

However, since the magnetically sensitive members and the wiring portions are formed separately in this method, the alignment of the connections therebetween is difficult. Conventional elements generally have one or both of the outer edges of the magnetically sensitive member formed with a narrow width and at least one of the outer edge of the wiring portion arranged along a straight line. However, in such a construction, an offset voltage often occurs due to a slight discrepancy in alignment at the connections between the magnetically sensitive members and wiring portions, discrepancy is inevitably generated during the production of the magnetoresistive element.

FIG. 3A shows one example of a designed pattern for the connections between the magnetically sensitive members 1 and the wiring portions 2 wherein the film widths equal to one another. In practice, the magnetically sensitive members 1 and wiring portions 2 are not simultaneously formed and, therefore, a discrepancy in alignment can easily occur, as shown in FIG. 3B. As a result, breakage of wiring tends to occur at boundaries between magnetically sensitive member 1 and wiring portion 2 and thus the element produced is unreliable. Moreover, the offset voltage becomes large due to the discrepancy in alignment as discussed previously.

FIG. 4A shows one example of a designed pattern of connections between magnetically sensitive members 1 and wiring portions 2 which are widened at only one side thereof with respect to the magnetically sensitive member 1. A discrepancy in alignment likewise arises in this case as shown in FIG. 4B, and wiring breakage is apt to occur at the boundaries between the magnetically sensitive members and the wiring portions. In such a case the offset voltage becomes high and, accordingly, the element is not reliable. Thus, if the magnetoresistive element is designed so that all the magnetically sensitive members have the same value of resistance, the discrepancy in the resistance value between the magnetically sensitive members inevitably arises due to the discrepancy in the pattern for connections between the magnetically sensitive members 1 and the wiring portions 2 during the manufacture of the magnetoresistive element.

FIG. 5 is a top plan view of another magnetoresistive element produced in the same manner as that shown in FIGS. 2A and 2B. Although, this example differs in the arrangement of the magnetically sensitive members from that shown in FIGS. 2A and 2B, the shape of the connecting portions between the magnetically sensitive members and the wiring portions is identical with that of the conventional example shown in FIGS. 2A and 2B and, therefore, this example suffers from the same problems as those explained previously.

The offset voltage phenomenon of a magnetoresistive element will now be explained briefly. FIG. 6 is a diagram of the equivalent circuit of the magnetoresistive element shown in FIG. 2A. The offset voltage means a voltage appearing on the output terminal even when a magnetic field is not applied to the magnetoresistive element and the value thereof is expressed as the voltage difference between the designed voltage of the output terminal and the observed voltage. In the equivalent circuit shown in FIG. 6, the offset voltage Voff is defined as follows: $V_{off} = V_{24} - V'_{24}$ on the hypothesis that the designed voltage difference is equal to $V_{24}$ and the observed voltage difference $V'_{24}$ between terminal electrodes 3-2 and 3-4, and is generated when an input voltage Vin is applied between the terminal electrodes 3-1 and 3-3.

In FIG. 6, $R_1$, $R_2$, $R_3$ and $R_4$ are resistance values of the wiring portions 2-1, 2-2, 2-3 and 2-4 shown in FIG. 2A respectively; and $R_{12}$, $R_{23}$, $R_{34}$ and $R_{14}$ are resistance values of the magnetically sensitive members 1 formed between the wiring portions 2-1 and 2-2, the wiring portions 2-2 and 2-3, the wiring portions 2-3 and 2-4 and the wiring portions 2-1 and 2-4 respectively. In addition, $r_{14}$, $r'_{14}$, $r_{34}$, $r'_{34}$, $r_{23}$, $r'_{23}$, $r_{12}$ and $r'_{12}$ represent combined resistance values of a part of the wiring portion 2 and the connecting portion respectively. In this connection, it is essential that $R_1$, $R_2$, $R_3$, $R_4$ and $r_{14}$, $r'_{14}$, $r_{34}$, $r'_{34}$, $r_{23}$, $r'_{23}$, $r_{12}$ and $r'_{12}$ are small in order to make the value of $\Delta R/R$ large. Moreover, if the values of $r_{14}$, $r'_{14}$, $r_{34}$, $r'_{34}$, $r_{23}$, $r'_{23}$, $r_{12}$ and $r'_{12}$ differ from each other, a scatter occurs in the designed resistance values in a bridge circuit including magnetically sensitive members and thus an offset voltage is generated. In the case where the construction of the connecting portion shown in FIG. 3A or FIG. 4A is adopted, and if the alignment between the magnetically sensitive members 1 and the wiring portions 2 deviates only slightly from the desired one, a scatter is caused between the values of $r_{12}$ to $r_{14}$ and the values of $r'_{12}$ to $r'_{14}$, which leads to the generation of the offset voltage. This offset voltage degrades the properties of the element and a low yield in the production of the elements results.

As explained above, the conventional magnetoresistive elements and the attempts towards the improvement thereof can suffer from severe problems in that an offset voltage is generated due to a discrepancy in the pattern of connections between the magnetically sensitive members and the wiring portions, a large resistance value of the wiring portions, or the like.

SUMMARY OF THE INVENTION

Accordingly, it is an object of the present invention to eliminate the aforementioned problems associated with the magneto resistive element and to thus provide a magnetoresistive element of a ferromagnetic material having a high sensitivity, and which does not generate an offset voltage due to the discrepancy in patterns of the connections between magnetically sensitive elements and wiring portions which otherwise can arise during manufacture of the magnetoresistive element. In other words, the object of the present invention is to provide a magnetoresistive element whose electrical symmetry is maintained even after an undesired slight translation from a desired alignment at the connected portions between the magnetically sensitive members and the wiring portions that can occur unavoidably during the manufacturing process.

In order to solve the aforementioned problems associated with the magnetoresistive element, the inventors of the present invention conducted studies on shapes of the connections between the magnetically sensitive members and the wiring portions. As a result, the inventors have found a shape thereof which exhibits a very low change in resistance as compared with that of the conventional shape of the connecting portions and, therefore, the generation of an offset voltage is substantially suppressed as compared with the conventional elements even if a discrepancy exists between the positions of the magnetically sensitive members and the wiring portions, which discrepancy inevitably arises during manufacturing processes. Moreover, the inventors have found a shape of patterns of the magnetoresistive element having a structure in which symmetry in the designed electric resistance of each magnetically sensitive member in the magnetoresistive element is not changed even if the positions of the magnetically sensitive members and the wiring portions are shifted towards the widthwise direction, the longitudinal direction of the magnetically sensitive member, or the like, and which, therefore, does not lead to the generation of an offset voltage.

In the first aspect of the present invention, a magnetoresistive element of ferromagnetic material comprises a plurality of magnetically sensitive members, each composed of a film of ferromagnetic material having a magnetoresistive effect; and wiring portions composed of a metallic film having a sheet resistance lower than that of the thin film of the magnetically sensitive members, the wiring portions being connected to each of the magnetically sensitive members at connecting portions and being widened on both sides of each of the magnetically sensitive members at the connecting portions.

Preferably, the width of the part of the magnetically sensitive member in the vicinity of the connecting portions may be broader than that of other member part.

It is also preferred that each of the connecting portions has a geometrically symmetrical shape.

It is still further preferred that the connecting portions between the magnetically sensitive members and the wiring portions, at their boundary, lie on a straight line or on two parallel straight lines so that the magnetically sensitive members may be connected to the wiring portions in a self-alignment manner.

In the second aspect of the present invention, in a method of forming an improved magnetoresistive element on a substrate, the element of the type having magnetoresistive members connected by wiring, the method comprises the steps of:

forming on the substrate a first layer of conductive material in a wiring pattern having member-connecting portions arranged along a straight line;

forming on the substrate a second layer of conductive material in a member pattern having one or more wiring-connecting portions each a predetermined width along the straight line;

the first layer forming step includes the step of extending the conductive material a distance greater than the predetermined width; and wherein the second layer forming step includes the step of positioning wiring-connecting portions along the straight line nesting contact within the member-connecting portions along the straight line, whereby each member-connecting portion extends part both sides of the respective contacting wiring-connecting portion along the straight line.

The above and other objects, effects, features and advantages of the present invention will become more apparent from the following description of preferred embodiments thereof taken in conjunction with the accompanying drawings.

BRIEF DESCRIPTION OF THE DRAWINGS

FIGS. 3A and 4A are diagrams showing conventional designed patterns of the portions connecting a magnetically sensitive member with a wiring portion and FIGS. 3B and 4B are, respectively, diagrams showing patterns of the connected portions in the conventional embodiments;

FIGS. 12A, 12B respectively show other embodiments of the magnetoresistive elements according to the present invention, wherein FIGS. 10A, 11A and 12A are top plan views and FIGS. 10B, 11B and 12B are sectional views thereof taken along the line A-A' in FIGS. 10A, 11A and 12A, respectively;

FIGS. 18, 19A, 19B, 20A, 20B, 21 and 22 are enlarged views of the connecting portions of embodiments of the magnetoresistive elements according to the present invention;

FIGS. 23A and 23B to FIGS. 29A and 29B are diagrams for illustrating methods for manufacturing the magnetoresistive element according to the present invention, and FIGS. 23A to 29A are top plan views of the element in the course of manufacture according to each of the processes while FIGS. 23B to 29B are sectional views thereof;

FIGS. 30A and 30B to FIGS. 35A and 35B are diagrams for illustrating other methods for manufacturing the magnetoresistive element according to the present invention, in which FIGS. 30A to 35A are top plan views of the element in the course of manufacture according to each of the processes while FIGS. 30B to 35B are sectional views thereof; and FIGS. 36A and 36B to FIGS. 42A and 42B are diagrams for illustrating yet other methods for manufacturing the magnetoresistive element according to the present invention, wherein FIGS. 36A to 42A are top plan views of the element in the course of manufacture according to each of the processes and FIGS. 36B to 42B are sectional views thereof.

DETAILED DESCRIPTION OF PREFERRED EMBODIMENTS

The preferred embodiments of a magnetoresistive element according to the present invention will be explained with reference to the accompanying drawings.

Figure 7:
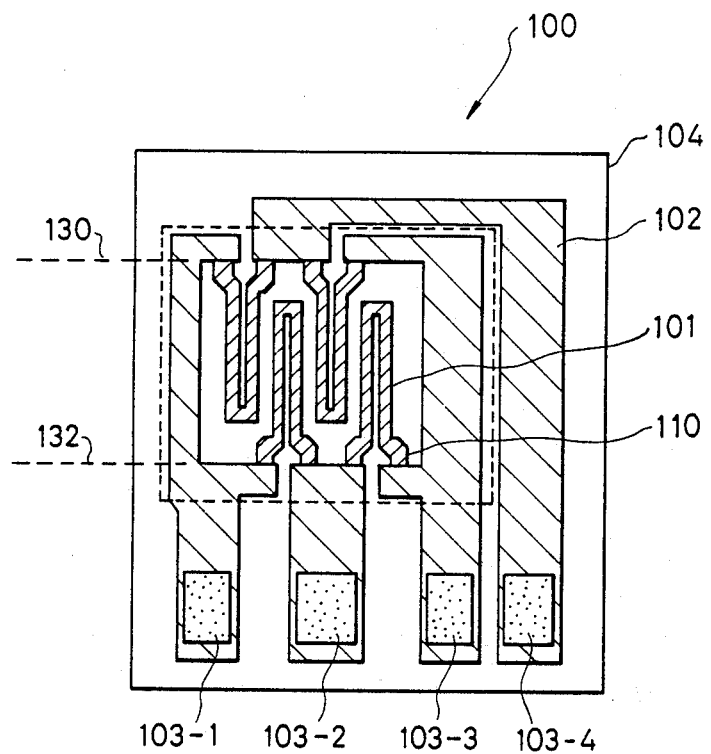
FIGS. 7, 8 and 9 are top plan views of embodiments of the magnetoresistive elements according to the present invention, respectively.

FIG. 7 shows a top plan view of one embodiment of the magnetoresistive element according to the present invention in which, for convenience, parts analogous to parts of element 0 in FIGS. 1-5 have the reference numeral in the 100-series. This embodiment is an example of such an element provided with four terminals. In FIG. 7, the reference numeral 100 represents the overall magnetoresistive element, the reference numeral 101 represents a magnetically sensitive member and 102 represents a wiring portion. In this respect, each wiring portion is provided with a respective connection terminal 103 (103-1, 103-2, 103-3 or 103-4). The wiring portion 102 is designed so that the sheet resistance thereof becomes sufficiently low.

There is a close relation between the resistance of the wiring portions and the sensitivity of the magnetoresistive element. In the conventional element shown in FIGS. 1A and 1B, the resistance value of the wiring portion commonly ranges from 5 to 10% of the total resistance of the magnetoresistive element. Since the sensitivity of the magnetoresistive element is given by $\Delta R/R$ as already mentioned above, if the resistance of the wiring portion is as large as 10%, the practical value of $\Delta R/R$ of the magnetoresistive element is on the order of only 2.7% even when the resistance of the magnetically sensitive member is changed by 3%. In the magnetoresistive element according to the present invention, the reduction in the sensitivity, $\Delta R/R$, is small since the sheet resistance of the wiring portion is limited to a low level as compared with that of the magnetically sensitive member. For instance, if the wiring portion is designed so that the sheet resistance thereof is equal to 1/5 times that of the magnetically sensitive member, the resistance of the wiring portion is in the range of from 1 to 2% even if the wiring portion is designed so as to have the same pattern as that of the conventional element and, therefore, the reduction in the sensitivity is extremely small since the practical value of $\Delta R/R$ falls within the range of from 2.94 to 2.97% assuming that the change in resistance of the magnetically sensitive member is equal to 3%.

Figure 6:
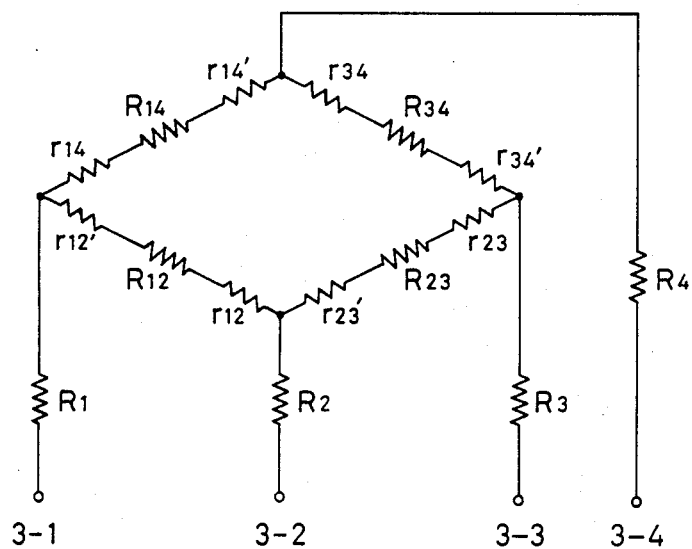
FIG. 6 is the equivalent circuit of a magnetoresistive element of a ferromagnetic material, provided with four terminals.

Moreover, since $r_{12}$ to $r_{14}$ and $r'_{12}$ to $r'_{14}$ in the equivalent circuit shown in FIG. 6 can be limited to a low level, it is possible to lower the absolute value of the scatter of these values and thus the offset voltage can be minimized.

Other features of this embodiment are that the width of the edge portion (the reference numeral 120 in the figures) of the wiring portions is wider than that of the edge portion (the reference numeral 110 in the figures) of the magnetically sensitive member at the connecting portions between the magnetically sensitive members and the wiring portions and that the wiring portions thus project out transversely outwardly of both sides of the magnetically sensitive member.

In the present embodiment, the magnetically sensitive member has a self-aligning construction in which the connecting portions thereof are automatically determined by the wiring portions and, therefore, the discrepancy in positions between the magnetically sensitive members and the wiring portions is minimized. Moreover, when the connecting portions are designed so as to have such a construction, no change in resistance of the connecting portion occurs even if an alignment discrepancy exists between the magnetically sensitive member and the wiring portions. Thus, there is no balance change in the resistances in the equivalent circuit shown in FIG. 6 and an offset voltage is not generated.

A further feature of this embodiment is that both the magnetically sensitive member and the wiring portion are arranged, at the principal portions, in a geometrically symmetrical shape. Referring now to the magnetically sensitive members and their neighborhood shown in FIG. 7, namely the area encompassed with a broken line in the figure, the connections of four magnetically sensitive members and the wiring portions are in symmetrical relations and thus the symmetrical properties of the resistances thereof are not impaired even if an alignment discrepancy exists between the magnetically sensitive members and the wiring portions. In this embodiment, those parts which do not have symmetry are only the wiring portions located at both right and left sides. However, these portions are of a low sheet resistance, as explained before, so as not to exert influence on the symmetry of the resistances. Consequently, the present embodiment makes it possible to significantly lower the value of the offset voltage due to the discrepancy in alignment.

A still further feature of this embodiment is that the member edges 110 near the connecting portions between the magnetically sensitive members and the wiring potions have a width broader than the other member portions. For this reason, the detrimental effects due to the alignment discrepancy can be reduced further. Details of, and methods for manufacturing, such a magnetoresistive element will also be explained henceforth.

Figure 8:
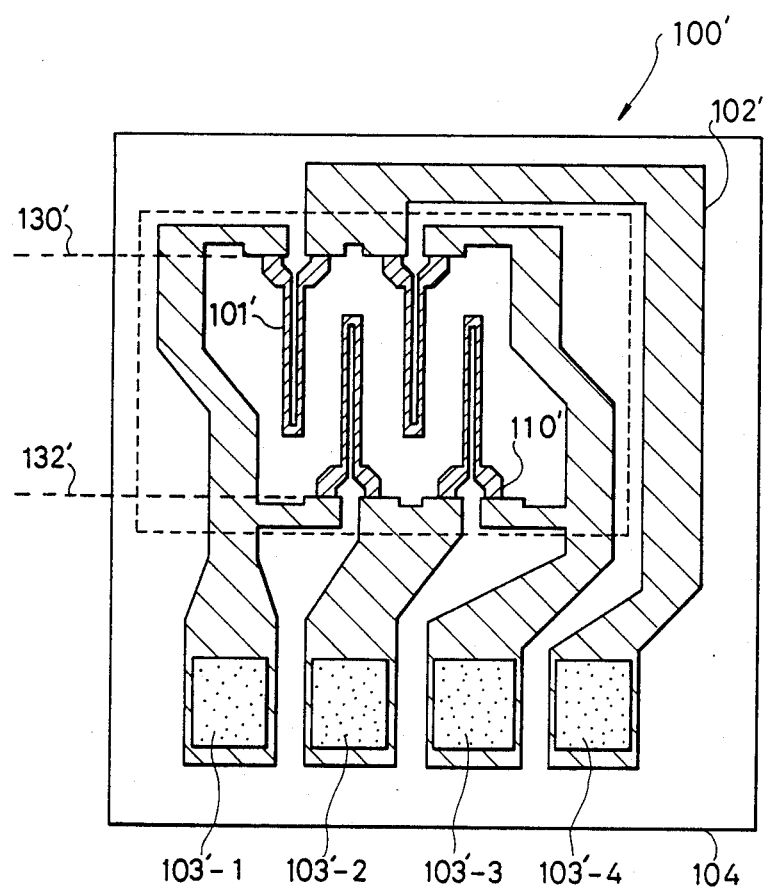

Another embodiment designated 100' of the magnetoresistive element according to the present invention is shown in FIG. 8. In this embodiment, the symmetry of the shape of the wiring portions is further improved as compared with the embodiment shown in FIG. 7, and thus the offset voltage generated due to any alignment discrepancy between the magnetically sensitive members and the wiring portions is in principle approximately zero.

Figure 9:
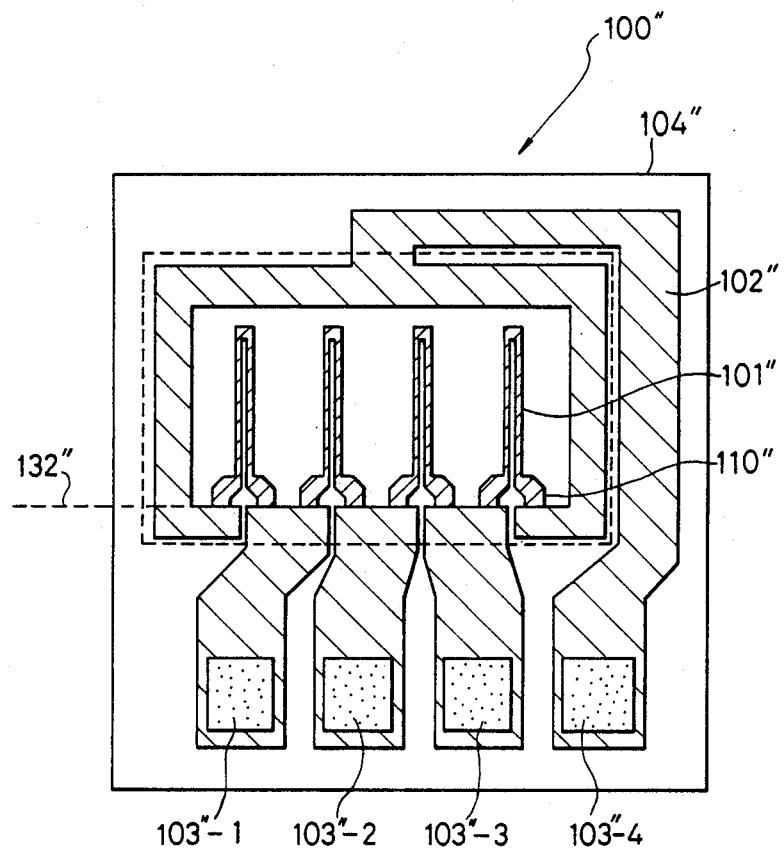

FIG. 9 shows still another embodiment 100" of the magnetoresistive element according to the present invention. While in the embodiments shown in FIGS. 7 and 8, the magnetically sensitive members are connected, two by two, to the wiring portions opposed to the members and the connecting portions are placed on two parallel straight lines, 130, 132 (FIG. 7) and 130', 132' (FIG. 8), in this embodiment, four magnetically sensitive members are connected to the wiring portions so as to lie on a single straight line 132" with regard to the latter. In this embodiment the sheet resistance of the wiring portion is likewise restricted to a sufficiently low level as compared with that of the magnetically sensitive member and the structure of the connecting portions between the magnetically sensitive members and the wiring portions is the same as that of the embodiment shown in FIG. 7. Each connecting portion between the magnetically sensitive member and the wiring portion has a symmetrical shape and likewise the shapes of the wiring portions encompassed by the broken line in the figure are substantially symmetrical. Thus, the magnetoresistive element of this embodiment also has a large value of $\Delta R/R$ and hence a high sensitivity and further almost no offset voltage due to the alignment discrepancy is generated.

Figures 10A, 10B:
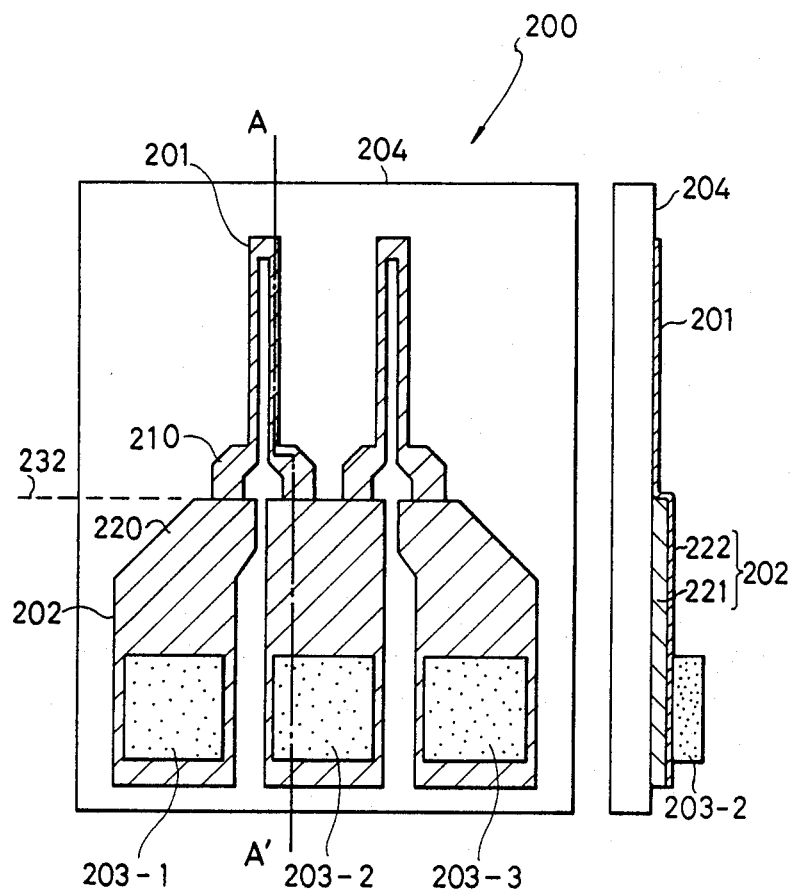
FIGS. 10A, 10B.

FIGS. 10A and 10B show another embodiment (200) of the magnetoresistive element provided with three terminals according to the present invention, wherein FIG. 10A is a top plan view thereof and FIG. 10B is a sectional view thereof taken along the line A-A' in FIG. 10A. In this figure, the reference numeral 201 represents a magnetically sensitive member, 210 represents member edge in the vicinity of wiring portion 202, the wiring portion being composed of a portion 221 which is thick and has a small sheet resistance and a portion 222 formed thereon from the same material as that of the magnetically sensitive member 201 and having a thickness equal to that of the latter. In addition, the reference numerals 203-1, 203-2 and 203-3 are terminals. Likewise, in this embodiment, the wiring portion also has a low sheet resistance and a large $\Delta R/R$ and thus the element is highly sensitive. Furthermore, the width of wiring portion edge 220 is wider along transverse line 232 than that of the magnetically sensitive member at the connecting portions between two magnetically sensitive members and the wiring portion and the shape of the connecting portions between the magnetically sensitive members and the wiring portions are symmetrical. Therefore, the scatter of the resistances due to the alignment discrepancy is not caused and thus the offset voltage is not generated at all.

Figures 11A, 11B:
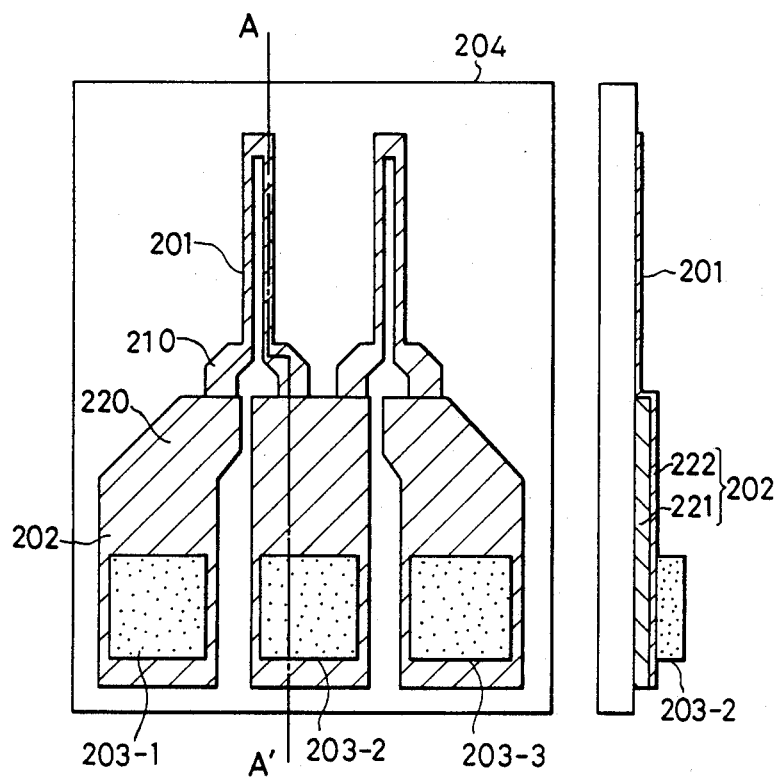
FIGS. 11A, 11B.
Figures 12A, 12B:
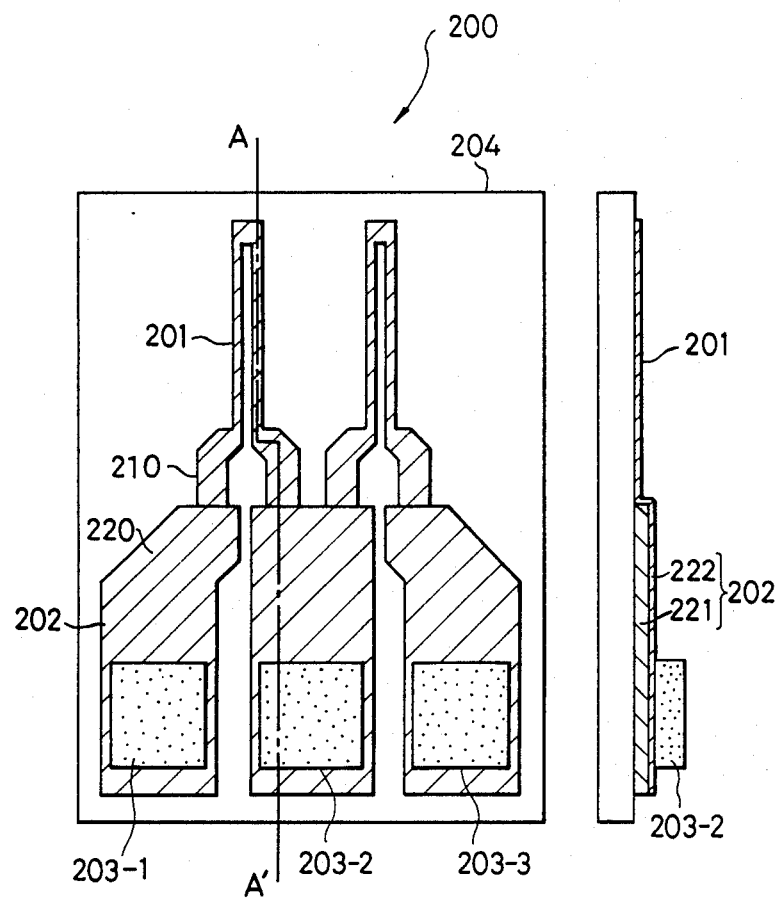
Figure 13:
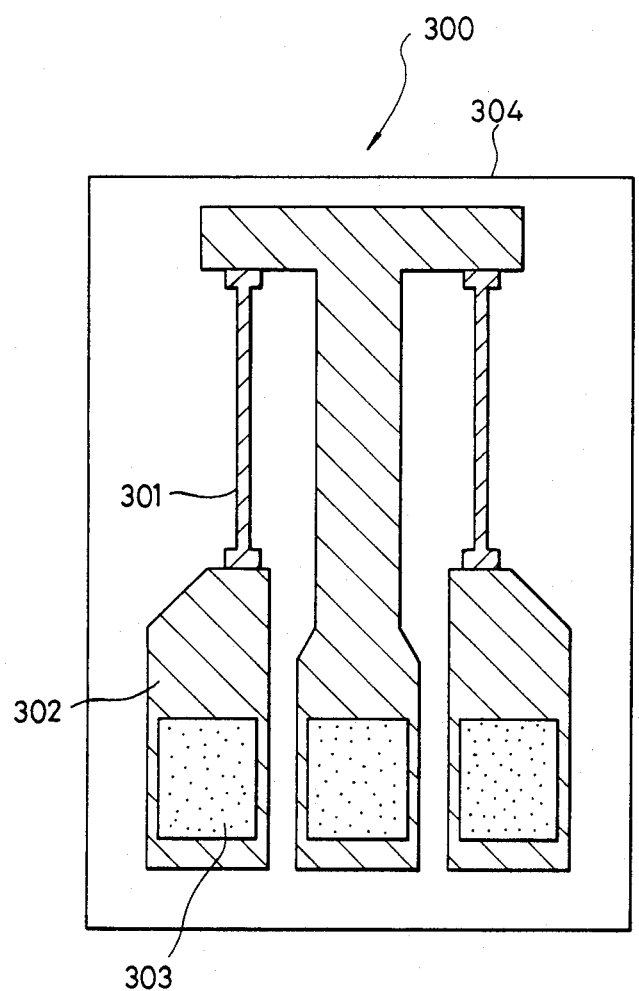
FIG. 13 to FIG. 17 are top plan views of still other embodiments of the magnetoresistive elements according to the present invention.
Figure 14:
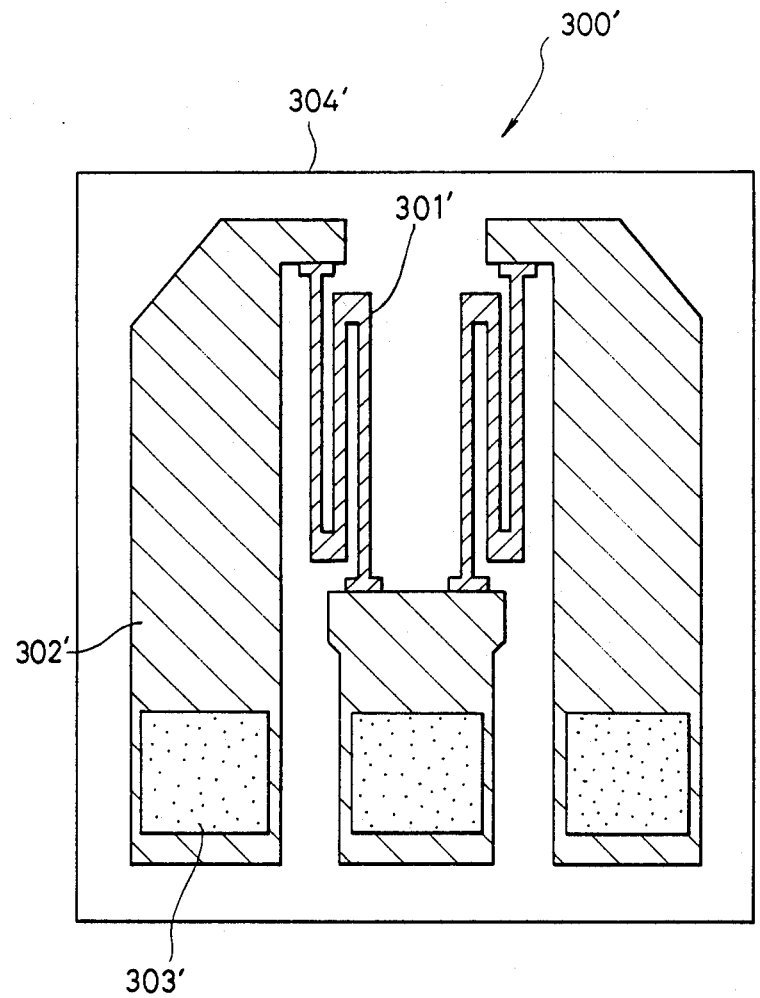
Figure 15:
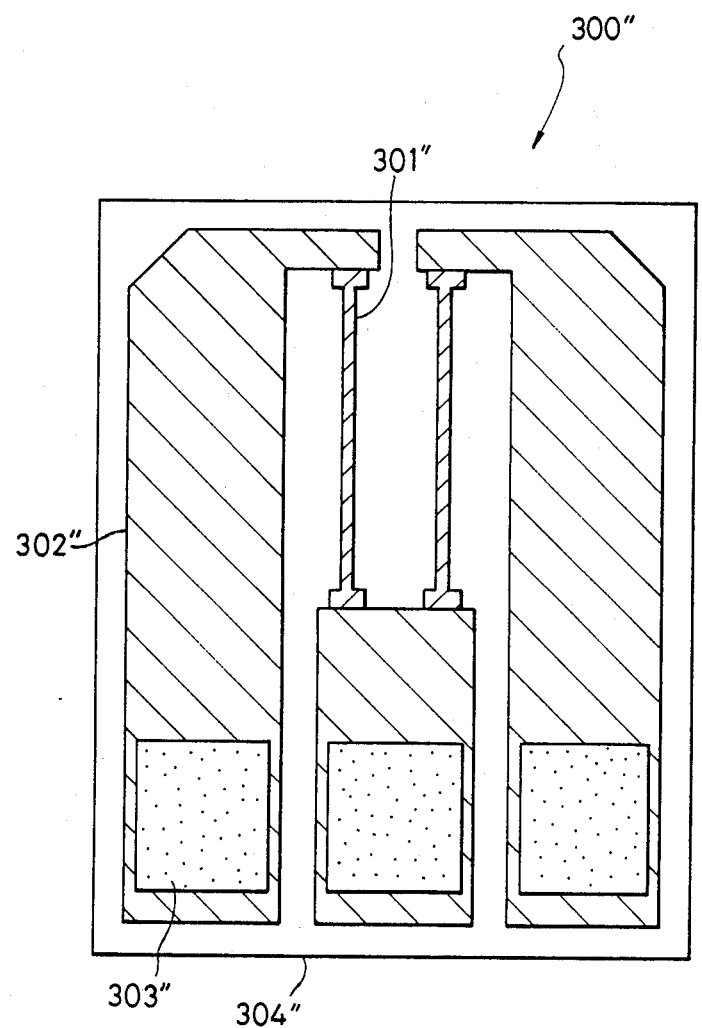
Figure 16:
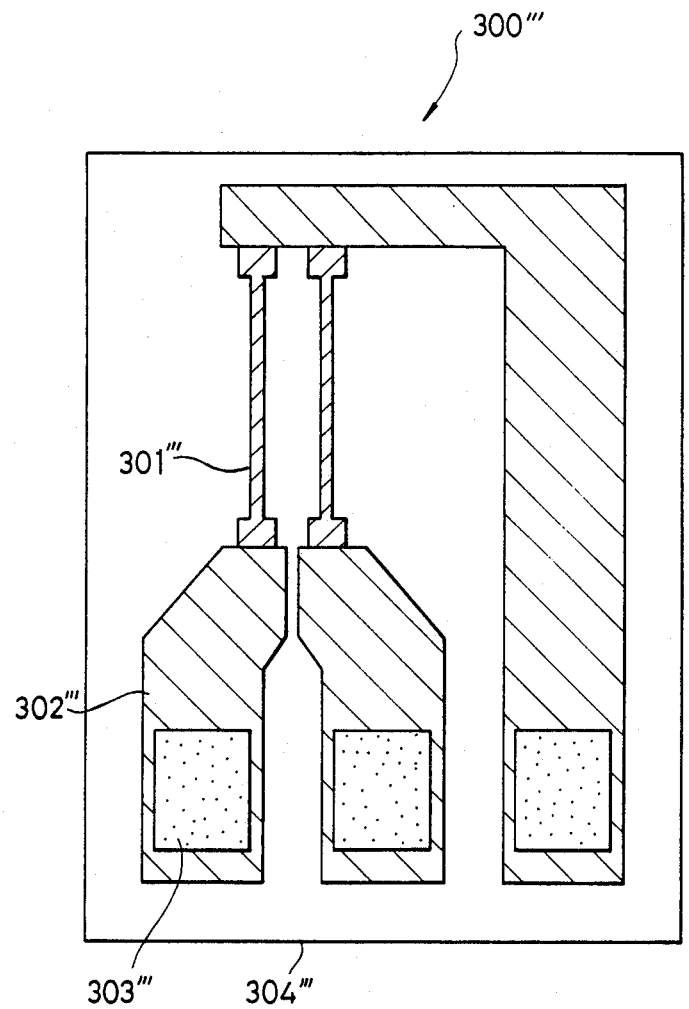
Figure 17:
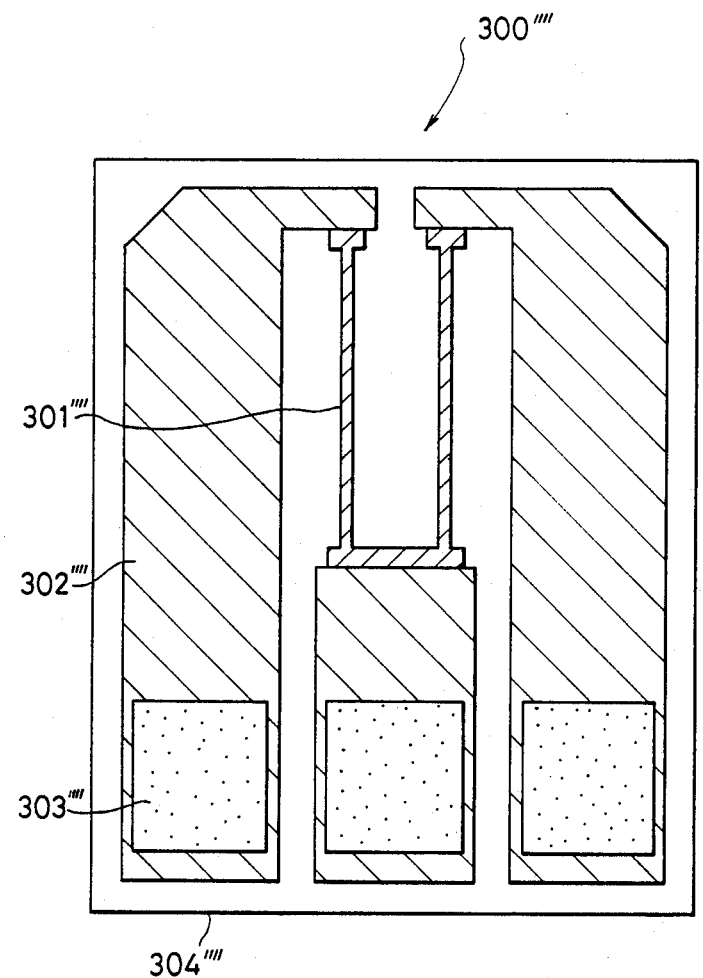

The reason why, according to this embodiment, no offset voltage is generated even if a discrepancy exists between the positions of the magnetically sensitive members and the wiring portions, will hereinafter be explained. FIGS. 11A, 11B and FIGS. 12A, 12B show such a case wherein a discrepancy exists, in which FIGS. 11A and 12A are top plan views thereof and FIGS. 11B and 12B are sectional views thereof taken along the line A-A' in the FIGS. 11A and 12A respectively.

Even if the wiring portions cause a shift towards left hand side during the formation of the patterns, with regard to the case shown in FIGS. 10A and 10B, as shown in FIGS. 11A and 11B, the magnetically sensitive members assure the connection with the wiring portions over the entire width of the connection since the width of the wiring portions are transversely wider than that of the magnetically sensitive member at the connecting portion. Accordingly, the symmetry of the resistances of the magnetically sensitive members and the wiring portions is substantially maintained and thus an offset voltage due to the shift in the positions thereof is not generated. On the other hand, FIGS. 12A and 12B show a case in which the magnetically sensitive members shift upward. In this case, the symmetry of the resistances of the magnetically sensitive members and the wiring portions is also maintained and thus an offset voltage due to the discrepancy in the positions is not generated.

Other embodiments of the magnetoresistive element, which have two magnetically sensitive members and three terminals, are shown in FIG. 13 to FIG. 17. In the embodiment 300 shown in FIG. 13, two straight magnetically sensitive members 301 are provided on both side of the central wiring portion. In the embodiment 300' shown in FIG. 14, two bent magnetically sensitive members 301' are provided on the central portion. In the embodiment 300" shown in FIG. 15, two straight magnetically sensitive members 301" are provided on the central portion. In the embodiment 300''' shown in FIG. 16, two straight magnetically sensitive members 301''' are provided on one side of one of the wiring portion. And in the embodiment 300'''' shown in FIG. 17, two straight magnetically sensitive members 301'''' are provided on the central portion and the two members are connected at one end portion. In all the embodiments, the sheet resistance of the wiring portions is designed to be sufficiently lower than that of the magnetically sensitive member. Moreover, as seen from each of these figures, in all the embodiments, the width of the wiring portions is transversely broader than that of the magnetically sensitive member, at the connecting portions therebetween and the magnetically sensitive members and the wiring portions have geometrically symmetrical shapes, respectively. Therefore, the generation of an offset voltage is not observed at all even if a discrepancy exists between the magnetically sensitive member and the wiring portions.

The width and the shape of the edges of the magnetically sensitive members at the connecting portion with the wiring portions will now be explained hereinunder.

FIG. 18 is a diagram illustrating one basic shape of the connecting portions between the magnetically sensitive members and the wiring portions in the magnetoresistive element according to the present invention. As seen from this figure, the magnetically sensitive member 401 has a uniform width down to the edge 410 thereof. The reference numeral 420 represents the edge of the wiring portion, the transverse width of which is sufficiently broader than that of the magnetically sensitive member 401, and which projects out of both sides of the edge 410 of the magnetically sensitive member. Therefore, even if there is a discrepancy in the alignment between the magnetically sensitive member 401 and the wiring portion 420, the resistance of the connecting portion substantially remains unchanged.

FIG. 19A is an enlarged diagram illustrating the connecting portion of the embodiment shown in FIG. 7. The edge portion 110 of the magnetically sensitive member 101 has a width broader than that of the portions other than the edges. If the width of the edges are broadened as shown in FIG. 19A or are widened so as to have a shape shown in FIG. 20A or FIG. 21 or other shapes, it would be possible to attain advantages as will be explained below. That is to say, even if in the alignment of the wiring portions with the magnetically sensitive members having a wide edge of a shape shown in FIG. 19A or FIG. 20A, the positions of the wiring portions 120 or 520 shift so that the edges of the magnetically sensitive member and the wiring portion lie on a straight transverse lines 132 and 532 as shown in FIGS. 19B and 20B, respectively, the balance of the resistances are substantially maintained and an offset voltage is not generated. Even when the wiring portions cause a further shift so that the magnetically sensitive member slightly shifts transversely outside the wiring portion, the values of the resistance are only slightly influenced by such a shift since the width of the edge portion e.g. portions 510 of the magnetically sensitive member 501 in FIG. 20A is sufficiently broad. This is also true in a case where the width of the member edge contacting with wiring portion 320 is broadened at both sides of the portions as shown in edge 310 in FIG. 21. Furthermore, if the width of the member edge of the magnetically sensitive member is designed so as to be broader than that of the portions other than the member edge 610 as shown in FIG. 22, the resistance of the edge becomes smaller than those of the other portions except for the edge and thus the edge 610 substantially constitutes a part of the wiring portion 620. Accordingly, if the width of the edge 610 of the magnetically sensitive member equals to that of the wiring portion 620 as will be seen from FIG. 22, the member edge 610 serves as the edge 620 of the wiring portion. Therefore, this is substantially identical with the embodiment shown in FIG. 18.

Practical method for manufacturing the magnetoresistive element according to the present invention and properties thereof will now be explained hereinbelow.

EXAMPLE OF MANUFACTURE 1

An example of manufacture of the magnetoresistive element according to the present invention will be explained with reference to the attached FIGS. 23A and 23B to FIGS. 29A and 29B. In this example, the magnetoresistive element provided with four terminals shown in FIG. 9 was produced. Each of FIG. 23A to FIG. 29A is a top plan view for illustrating the element in the course of each production step and each of FIG. 23B to FIG. 29B is the corresponding sectional view taken along the line A-A' in each of FIG. 23A to FIG. 29A.

Figures 29A, 29B:
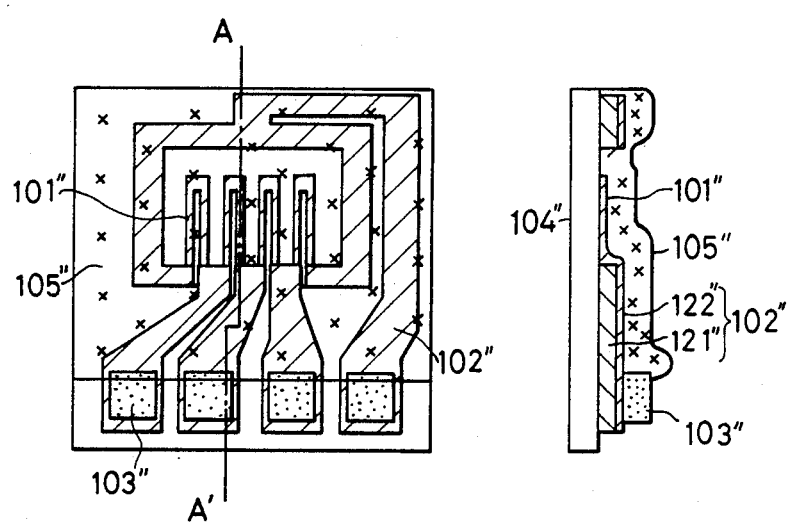
Figures 34A, 34B:
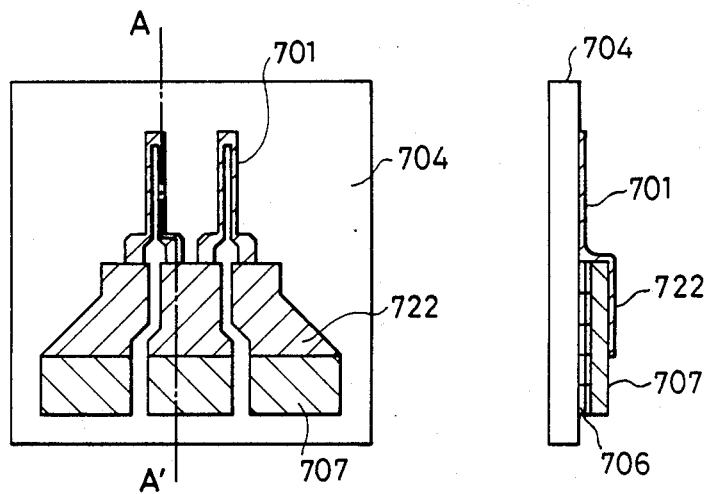

As seen from FIGS. 23A and 23B, on the entire surface of a glass substrate 104" of 2 inches square, which had been subjected to mirror polishing, a thin film 121" of Ni-Co alloy having a thickness of 3,000 Å and a low sheet resistance (not more than 0.5Ω) was formed by DC sputtering technique while maintaining the substrate at 300° C. under heating. Then, a part of the thin film 121" of Ni-Co alloy was removed by etching, through a mask of photoresist, with an etchant obtained by admixing 63g/l ammonium persulfate solution and 2% sulfuric acid, as shown in FIGS. 24A and 24B. Thereafter, a thin film 122" of Ni-Co alloy (the sheet resistance thereof being in the order of 2.5Ω) having a composition identical to that of the thin film 121" and a thickness of 600 Å was deposited on the exposed surface of the substrate and the Ni-Co alloy film 121" while heating the entire surface of the substrate, as shown in FIGS. 25A and 25B. Then, as shown in FIGS. 26A and 26B, magnetically sensitive member 101" (9 μm in width and 2 mm in length) were formed according to ion milling technique utilizing a mask of photoresist. Furthermore, Ni layers and Au layers were formed according to a method capable of plating only desired portions such as a pattern plating technique or the like in order to obtain terminal portions 103" for external connection as shown in FIGS. 27A and 27B. Thereafter, a part of the films 121" and 122" of ferromagnetic alloy was etched to form wiring portions 102" and thus the magnetoresistive element of ferromagnetic material provided with four terminals as shown in FIGS. 28A and 28B was obtained. The width of the wiring portions was 700 μm, in the neighborhood of the terminals. Although the magnetically sensitive members are shown as a simplified shape, the shape thereof is essentially identical to that of the embodiment shown in FIG. 9. Thus, a passivation film 105" composed of an oxide film such as silicon dioxide or silicon nitride was formed, as shown in FIGS. 29A and 29B, to finish the element of the present invention. Then the glass substrate was cut into a size of 4 mm in width and 5 mm in length to give individual elements.

As seen from the attached figures, according to the method of this example, windows are formed on the film of the material for forming the wiring portions and one side of each window serves as the part which is connected to the magnetically sensitive member. The magnetically sensitive member is formed within the window and a part thereof is elongated so as to cover the wiring portion. Therefore, the connecting portions between the magnetically sensitive members and the wiring potions are located in a self-aligning manner with respect to the wiring portions. Moreover, as already explained above, the connecting portions between the magnetically sensitive members and the wiring portions are designed so as to have a shape which does not unbalance the values of the resistance even if an alignment discrepancy exists.

Figure 1A:
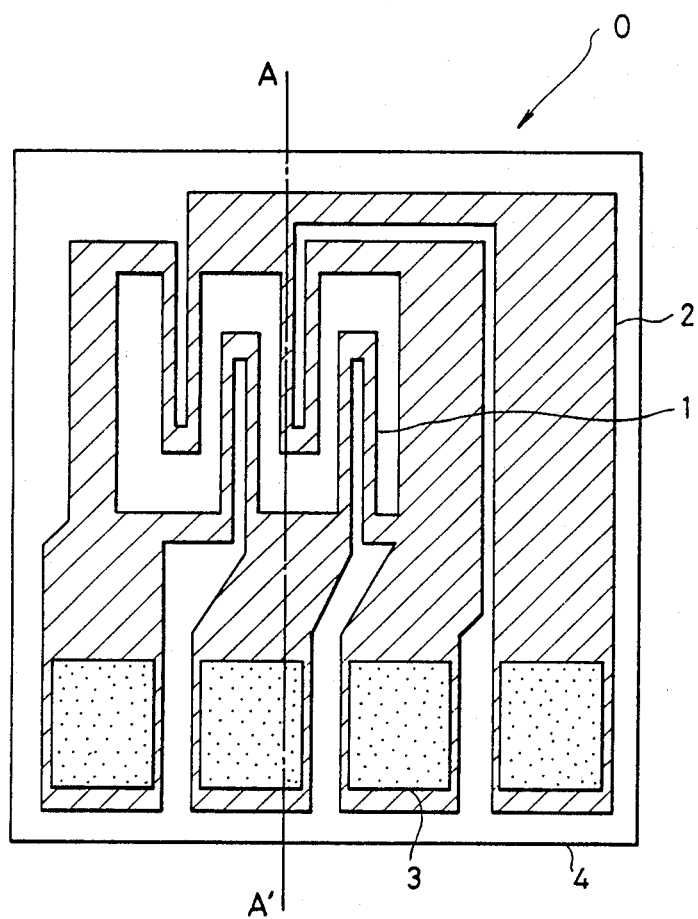
FIG. 1A is a top plan view of one example of a conventional magnetoresistive element and FIG. 1B is a sectional view thereof taken along the line A-A' in FIG. 1A.
Figure 1B:
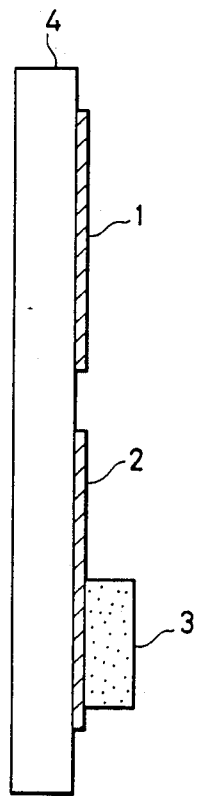
Figure 2A:
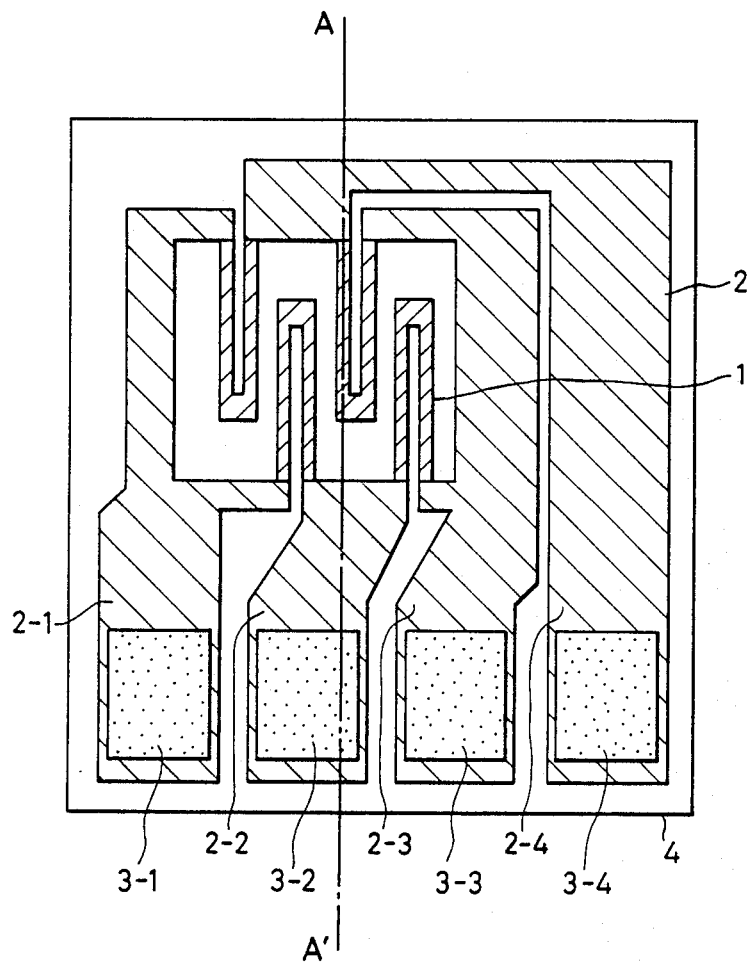
FIG. 2A is a top plan view of another example of a conventional magnetoresistive element and FIG. 2B is a sectional view thereof, taken along the line A-A' in FIG. 2A.
Figure 2B:
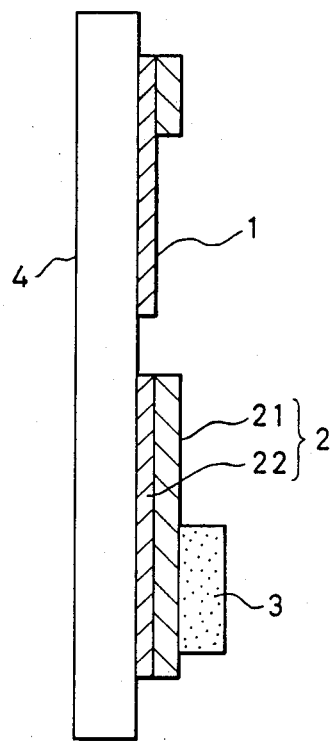
Figure 5:
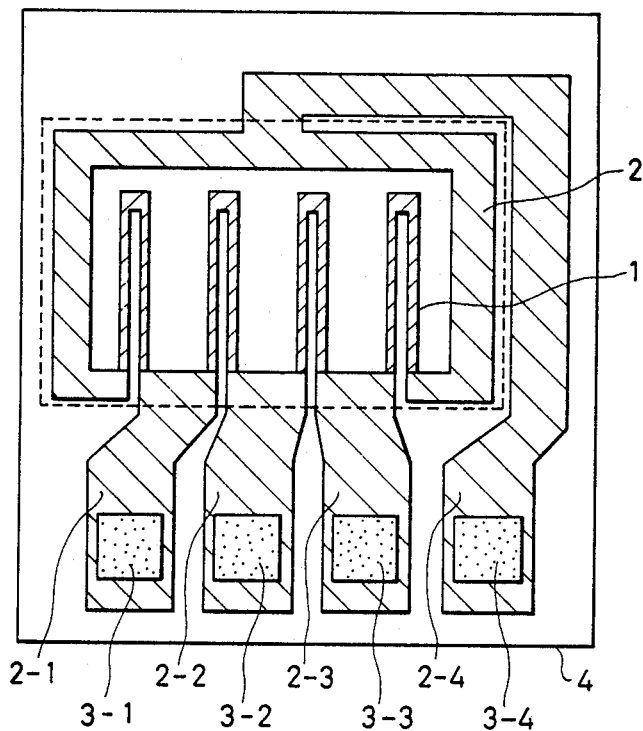
FIG. 5 is a top plan view of another example of a conventional magnetoresistive element.

For the purpose of comparison, a magnetoresistive element shown in FIG. 5, which has a shape relatively similar to that of the element of this example, was manufactured as a comparative example. The size of this comparative example is similar to that of the present embodiment and the externals thereof have a size 4 mm in width and 5 mm in length while the magnetically sensitive member has a length of 2 mm and a width of 9 $\mu$m. The width of the wiring portions in the vicinity of the terminals is designed to be 700 $\mu$m.

From the viewpoint of design, both the example of the invention and the comparative example are formed in a shape which never generates any offset voltage. More specifically, these elements are designed so that, in the equivalent circuit shown in FIG. 6, $R_{12}=R_{23}=R_{34}=R_{14}$; $r'_{12}+R_{12}+r_{12}=r'_{23}+R_{23}+r_{23}$ and $r_{14}+R_{14}+r'_{14}=r_{34}+R_{34}+r'_{34}$.

The values of the offset voltage and the sensitivity ($\Delta R/R$) of the elements thus produced in the example and the comparative example are summarized in Table 1. In this respect, the offset voltage herein means a potential difference generated, without the application of a magnetic field, between the terminals 103-2 and 103-4 and between the terminals 3-2 and 3-4 shown in FIGS. 7 and 5, respectively when a voltage of 5 V is applied between the terminals 3-1 and 3-3 as shown in the same figures while the values of $\Delta R/R$ are those determined under the presence of a static magnetic field of 200 Oe. The both offset voltage and $\Delta R/R$ are expressed as the average of measurements on 100 elements and the dispersion around the same.

TABLE 1

|  | Offset Value (mV) | $\Delta R/R$ (%) |
| --- | --- | --- |
| Example of the present invention | 1.25 ± 2.9 | 3.12 ± 0.2 |
| Comparative Example | 15.8 ± 7.9 | 2.95 ± 0.2 |

As seen from the results listed in Table 1, the element of the present invention has a very low offset voltage and dispersion as compared with the conventional element. It is desired that the offset voltage not be more than 10 mV expressed as the absolute value. Thus, productions of the element of the present invention can achieve a very high yield. In addition, the sensitivity, $\Delta R/R$, of the element of the present invention is quite excellent as compared with the conventional element.

The same procedures as described above were repeated to give a magnetoresistive element except that an Ni-Fe alloy was employed instead of the Ni-Co alloy. Similar results to those described above were obtained. Thus, the present invention is effective independently of the materials such as Ni-Co alloys or Ni-Fe alloys and is useful for magnetically sensitive members of the magnetoresistive element.

EXAMPLE OF MANUFACTURE 2

According to processes completely similar to those in Example of Manufacture 1, there were produced elements provided with three terminals according to the present invention as shown in FIGS. 10A and 10B and conventional elements provided with three terminals having a shape similar to the elements of the invention as comparative examples. The external shape of the elements of the present invention and the comparative example thus produced were of a size 3 mm wide and 4 mm long, wherein the magnetically sensitive member was of a size 1.5 mm long and 9 $\mu$m wide and the width of the wiring portions in the vicinity of the terminals was designed to be 600 $\mu$m. These elements were designed so as not to generate any offset voltage. In this case, the offset voltage is defined as a difference between the design voltage and the actual voltage observed on the terminal 203-2 when an input is applied between the terminals 203-1 and 203-3 of the element shown in FIGS. 10A and 10B under a condition that the external magnetic field is zero.

If the element is designed so that the resistances $R_{12}$ and $R_{23}$ of the corresponding magnetically sensitive members are equal to one another and that the resistances $R_1$ and $R_3$ of the corresponding wiring portion are also equal to one another, the middle point potential on the terminal 203-2 becomes just half of the input voltage, at zero magnetic field. In this Example of Manufacture, the elements were designed so that $R_{12}=R_{23}$ and $R_1=R_3$.

The offset values and the sensitivity, $\Delta R/R$, of these elements produced according to such a method are summarized in Table 2. As in Example of Manufacture 1, the offset voltage is one observed when applying an input of 5 V and the value of $\Delta R/R$ is one determined under the presence of a static magnetic field of 200 Oe.

TABLE 2

|  | Offset Value (mV) | $\Delta R/R$ (%) |
| --- | --- | --- |
| Example of the present invention | 0.13 ± 3.1 | 3.05 ± 0.18 |
| Comparative Example | 7.25 ± 8.3 | 2.97 ± 0.21 |

The foregoing results are approximately identical with those in Example of Manufacture 1, that is, the element according to the present invention has a very low offset voltage and a small dispersion as compared with the conventional element. Moreover, the sensitivity, $\Delta R/R$, of the element of the present invention is excellent compared with that of the conventional element.

EXAMPLE OF MANUFACTURE 3

Example of Manufacture of still another magnetoresistive element according to the present invention will hereinafter be explained with reference to the attached FIGS. 30A and 30B to FIGS. 35A and 35B wherein each of FIG. 30A to FIG. 35A is a top plan view of the element in the course of each production process and each of FIG. 30B to 35B is a sectional view thereof taken along the line A-A' in the corresponding FIG. 30A to FIG. 35A. This Example relates to the production of another element (700-FIG. 35A) provided with three terminals.

Figures 35A, 35B:
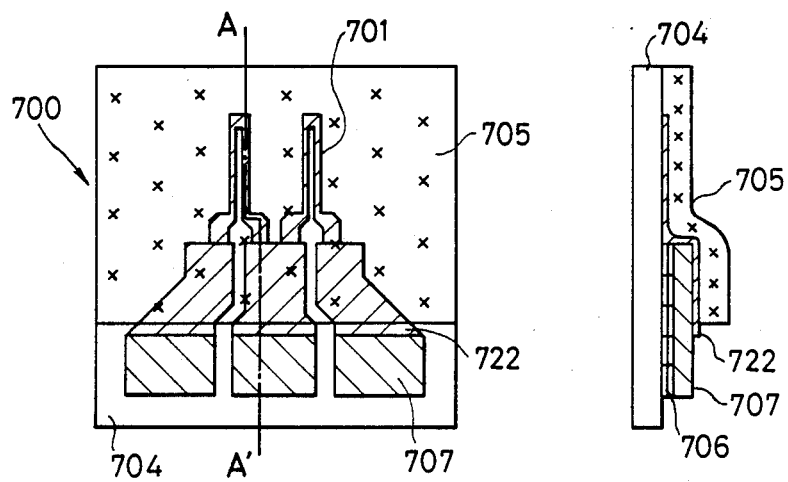

As shown in FIGS. 30A and 30B, a thin film 706 of Ti having a thickness of 2000 Å and a thin film 707 of Au having a thickness of 1 μm were deposited on the entire surface of a glass substrate 704 of 2 inches square, which had been subjected to mirror polishing, according to vacuum deposition technique while heating the substrate at 300° C. Then, according to ion milling technique, parts of the thin layers of Au and Ti were removed by simultaneously etching them through a mask of photoresist as shown in FIGS. 31A and 31B. Thereafter, as shown in FIGS. 32A and 32B, a thin film 722 of Ni-Co alloy having a thickness of 600 Å (sheet resistance thereof being in the order of 2.5Ω) was formed on the entire surface of the substrate, i.e., on the residual Au film 707 and the exposed surface of the substrate by DC sputtering while heating the entire surface of the substrate. As shown in FIGS. 33A and 33B, patterns of magnetoresistive elements 701 were then formed by ion milling technique using a mask of photoresist. Next, a part of the thin film 722 of Ni-Co alloy corresponding to the terminal portions was removed by etching the film with the same etchant as used in Example of Manufacture 1 to form Au pad portions as in FIGS. 34A and 34B. Thereafter, a passivation film 705 composed of SiO₂ was formed thereon to complete elements according to the present invention as shown in FIGS. 35A and 35B. Properties of the element thus produced are summarized in Table 3. In Table 3, the offset voltage and the sensitivity ΔR/R were determined according to the same manner as in Example of Manufacture 2.

TABLE 3

| | Offset Value (mV) | ΔR/R (%) |
| --- | --- | --- |
| Properties of the Element | 1.03 ± 1.8 | 3.21 ± 0.21 |

Thus, even if a method different from those disclosed in Examples of Manufacture 1 and 2 was used to produce the element, it is possible to manufacture elements having a very low offset voltage and a high sensitivity, ΔR/R.

EXAMPLE OF MANUFACTURE 4

Another Example of Manufacture namely that of the magnetoresistive element 700' (FIG. 42A) according to the present invention will hereinafter be explained with reference to the attached FIGS. 36A and 36B to FIGS. 42A and 42B in which each of FIG. 36A to FIG. 42A is a top plan view of the element in the course of each production process and each of FIG. 36B to FIG. 42B is a sectional view thereof taken along the line A-A' in the corresponding FIG. 36A to FIG. 42A.

Figures 42A, 42B:
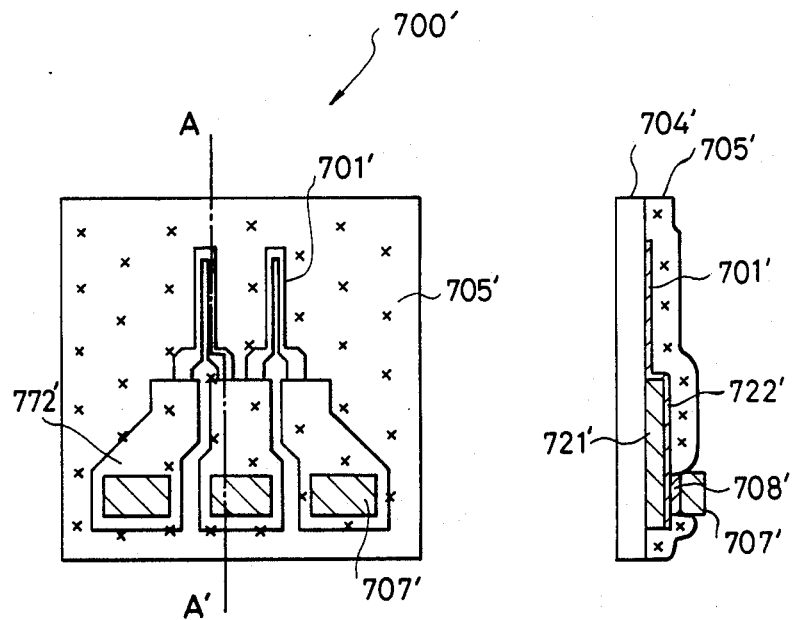

As shown in FIGS. 36A and 36B, a thin film 721' of Ni-Co alloy having a thickness of 3,000 Å was deposited on the entire surface of a glass substrate 704' of 2 inches square, which had been subjected to mirror polishing treatment, according to DC sputtering while maintaining the glass substrate at 300° C. by heating it. As shown in FIGS. 37A and 37B, unwanted portions of the thin film 721' of Ni-Co alloy were then removed by etching the film with an ammonium persulfate type etchant similar to that used in Example of Manufacture 1 utilizing a mask of photoresist. Then, a thin film 722' of Ni-Co alloy having a thickness of 600 Å and the same composition as that of the film 721' was formed on the entire surface of the substrate, i.e., the remaining Ni-Co alloy film 721' and the exposed surface of the substrate according to DC sputtering technique as shown in FIGS. 38A and 38B. Next, patterns of magnetoresistive elements including magnetically sensitive members 701' and wiring portions 722' were formed through a mask of photoresist by ion milling technique as shown in FIGS. 39A and 39B. A film 705' of SiO₂ was then deposited on the entire surface of the substrate, i.e., on the remaining Ni-Co alloy film 722' and the exposed surface of the substrate at a thickness of about 2 μm, then parts of the SiO₂ film corresponding to the terminal portions were removed by etching it with an HF type etchant utilizing a mask of photoresist as shown in FIGS. 40A and 40B. Thereafter, an Ni film 708' was deposited on the entire surface of the exposed Ni-Co alloy film 722' and the remaining SiO₂ film 705' by DC sputtering as shown in FIGS. portions and the Ni film free from Au plating was removed by etching as shown in FIGS. 42A and 42B to complete the element of the present invention.

Properties of the element thus produced are shown in Table 4. In this case, the offset voltage and the sensitivity, ΔR/R, were likewise determined according to the same procedures as in Example of Manufacture 2.

TABLE 4

| | Offset Value (mV) | ΔR/R (%) |
| --- | --- | --- |
| Properties of the Element | 0.32 ± 2.5 | 3.13 ± 0.16 |

Thus, even if the element was produced according to the aforementioned method of Example of Manufacture 4, it is likewise possible to manufacture elements having a very low offset voltage and a high sensitivity, ΔR/R.

As explained above, according to the present invention, the sensitivity of the magnetoresistive elements can be enhanced since the sheet resistance of the wiring portions thereof is designed to be in a low level. And moreover, since the shape of the connecting portions between the magnetically sensitive members and the wiring portions is designed so that the change in the resistance due to the discrepancy of alignment is very low and that the symmetry of the electric resistances between the magnetically sensitive members of the magnetoresistive element is not changed due to the discrepancy of positions originated from a shift of the relative positions of the magnetically sensitive members and wiring portions in the parallel direction, the generation of the offset voltage can in principle be restricted to a very low level.

Moreover, the magnetoresistive element according to the present invention is designed to have a structure in which the magnetically sensitive members are connected to the wiring portions in a self-aligning manner.

Therefore, the magnetoresistive elements according to the present invention can easily be manufactured in a high yield and without requiring a unduly precise mask alignment. The present invention is quite convenient in mass production of the magnetoresistive elements since the present invention makes it possible to easily manufacture elements having in particular a high sensitivity and a high reliability.

What is claimed is:

1. A magnetoresistive element comprising:
    a plurality of longitudinally directed magnetically sensitive members each composed of a film of material having a magnetoresistive effect and having a pair of connecting ends;

terminal members for external connections; and wiring members placed between said magnetically sensitive members and said terminal members and having first wiring connecting portions connected to respective ones of said member connecting ends and second wiring connecting portions connected to respective ones of said terminal members;

wherein each of said wiring members is composed of a film having a sheet resistance lower than that of said magnetically sensitive members, sheet resistance being defined as the resistivity of the film material divided by its thickness, and wherein said first wiring connecting portions are transversely widened compared with the transverse widths of said magnetically sensitive member connecting ends, for reducing misalignment-induced offset voltages.

2. The magnetoresistive element as claimed in claim 1, wherein the width of said magnetically sensitive member connecting ends in the vicinity of said first wiring connecting portions is broader than that of other parts of said magnetically sensitive member.

3. The magnetoresistive element as claimed in claim 1, wherein each of said first wiring connecting portions has a geometrically symmetrical shape.

4. The magnetoresistive element as claimed in claim 1, wherein the respective boundaries formed by the connections between said first wiring connecting portions and said magnetically sensitive member connecting ends, lie on one or more parallel straight lines, said magnetically sensitive members being transversely self-aligned with said wiring members.

5. The magnetoresistive element as claimed in claim 4, wherein the boundaries of said first wiring connecting portions and said magnetically sensitive member connecting ends, lie on two parallel straight lines, said magnetically sensitive members being transversely self-aligned with said wiring members.

6. Method of forming a film-type magnetoresistive element on a substrate, the element of the type having longitudinally elongated magnetoresistive members connected to terminals by wiring members, the method comprising the steps of:

forming on the substrate a first layer of a conductive material in a wiring member pattern having wiring connecting portions arranged transversely along one or more straight parallel lines; and forming on the substrate a second layer of a magnetosensitive material to have a greater sheet resistance than that of the first layer, and in a magnetoresistive member pattern having one or more member connecting ends each of a predetermined width arranged along the straight line;

wherein said first layer forming step includes the step of extending the width of the wiring conductive portions transversely a distance greater than said predetermined width along the straight line, and wherein said second layer forming step includes the step of positioning the member connecting ends along the straight line in nesting contact with respective wiring connecting portions, whereby each wiring connecting portion extends transversely to either side of the respective member connecting end along the straight line.

7. The magnetoresistive element as claimed in claim 1, wherein each of said magnetically sensitive members has at least one geometrically symmetrical shape.

8. The magnetoresistive element as claimed in claim 1, wherein longitudinally extended portions of said magnetically sensitive member ends are over-laid on said first wiring connecting portions.

9. The magnetoresistive element as claimed in claim 8, wherein the thickness of said wiring members is greater than that of said magnetically sensitive members.

10. The magnetoresistive element as claimed in claim 9, wherein said thickness of said wiring members is at least 3 times as great at that of said magnetically sensitive members.

11. The magnetoresistive element as claimed in claim 1, wherein the resistivity of said film composing said wiring members is lower than that of said film composing said magnetically sensitive members.

12. The magnetoresistive element as claimed in claim 1, wherein said sheet resistance of said wiring members is not more than one fifth of that of said magnetically sensitive members.

13. The method for forming a magnetoresistive element as claimed in claim 6, wherein said second layer forming step includes the step of overlaying the magnetosensitive material layer onto the wiring members as the magnetically sensitive members are being formed on the substrate.

14. The method for forming a magnetoresistive element as claimed in claim 13, including the further step of forming terminal members in contact with overlayed portions of the first layer at locations separate from said wiring member connecting portion.

15. The method for forming a magnetoresistive element as claimed in claim 6, including the step of forming a third layer of a passivation material covering substantially all of said first layer and said second layer.

16. The method for forming a magnetoresistive element as claimed in claim 6, wherein said first and second layer forming steps includes the respective steps of forming the thicknesses of said wiring members to be greater than that of said magnetically sensitive members.

17. The method of forming a magnetoresistive element as claimed in claim 6, including the preliminary step of selecting the conductive and magnetosensitive materials such that the resistivity of said conductive material first layer is lower than that of said magnetosensitive material second layer.

18. The method as in claim 6 including the further step of forming terminal members in contact with other wiring connecting portions of the wiring member pattern.

* * * * *